US010816595B2

(12) United States Patent
Jin et al.

(10) Patent No.: US 10,816,595 B2
(45) Date of Patent: Oct. 27, 2020

(54) SELF-TEST APPARATUSES HAVING DISTRIBUTED SELF-TEST CONTROLLER CIRCUITS AND CONTROLLER CIRCUITRY TO CONTROL SELF-TEST EXECUTION BASED ON SELF-TEST PROPERTIES AND METHOD THEREOF

(71) Applicant: NXP USA, INC., Austin, TX (US)

(72) Inventors: Xiankun Jin, Austin, TX (US); Jan-Peter Schat, Hamburg (DE); Tao Chen, Austin, TX (US); Lei Ma, Wijchen (NL)

(73) Assignee: NXP USA, Inc., Austin, TX (US)

( * ) Notice: Subject to any disclaimer, the term of this patent is extended or adjusted under 35 U.S.C. 154(b) by 118 days.

(21) Appl. No.: 16/165,411

(22) Filed: Oct. 19, 2018

(65) Prior Publication Data
US 2020/0124662 A1 Apr. 23, 2020

(51) Int. Cl.
*G01R 31/28* (2006.01)
(52) U.S. Cl.
CPC ................. *G01R 31/2884* (2013.01)
(58) Field of Classification Search
CPC .................................................. G01R 31/2884
USPC .................................................. 714/724–745
See application file for complete search history.

(56) References Cited

U.S. PATENT DOCUMENTS

| 5,920,515 | A | * | 7/1999 | Shaik | .................... | G11C 29/844 |
| | | | | | | 365/200 |
| 6,728,916 | B2 | | 4/2004 | Chen et al. | | |
| 6,978,411 | B2 | * | 12/2005 | Huang | .................... | G11C 29/56 |
| | | | | | | 324/73.1 |
| 7,262,621 | B1 | | 8/2007 | Caffee et al. | | |
| 7,436,222 | B2 | | 10/2008 | Shyr et al. | | |
| 2007/0234160 | A1 | | 10/2007 | Oota | | |
| 2010/0107025 | A1 | | 4/2010 | Sakada et al. | | |
| 2010/0229038 | A1 | | 9/2010 | Mayer et al. | | |
| 2017/0205462 | A1 | * | 7/2017 | Mukherjee | ....... | G01R 31/31855 |

(Continued)

FOREIGN PATENT DOCUMENTS

| DE | 19538337 A1 | 4/1997 |
| EP | 2343564 A1 | 7/2011 |

OTHER PUBLICATIONS

IEEE 1149.4 Standard for a Mixed-Signal Test Bus (2010).
(Continued)

*Primary Examiner* — Jay Patidar

(57) ABSTRACT

A self-test apparatus for use in an electronic system includes an inter-chip communication bus, a plurality of circuit devices, circuitry including memory, and test controller circuitry. The plurality of circuit devices each has a distributed self-test controller circuit and analog, mixed signal or digital circuit elements. The distributed self-test controller circuits are integrated communicatively via the inter-chip communication bus and negotiate a self-test protocol with each other. The circuitry including memory stores self-test properties of the circuit elements, the self-test properties corresponding to an identifier of each of the circuit elements and a manner or protocol in which the circuit elements are tested. The test controller circuitry collects the self-test properties of the circuit elements and controls execution of the self-test according to the negotiated self-test protocol and the self-test properties.

18 Claims, 5 Drawing Sheets

(56) References Cited

U.S. PATENT DOCUMENTS

2017/0331699 A1 11/2017 Lee et al.
2019/0355436 A1* 11/2019 Shin .................. G11C 29/10

OTHER PUBLICATIONS

IEEE 1687 Standard for Access and Control of Instrumentation Embedded within a Semiconductor Device (2014).

Measuring mixed-signal test stimulus quality, Stephen Sunter, Krzysztof Jurga, 2018 23rd IEEE European Test Symposium (ETS), pp. 1-6 (2018).

R. De Vries et al., Built-In Self-Test Methodology for A/D Converters, European Design and Test Conference, Mar. 17-20, 1997, https://ris.utwente.nl/ws/portalfiles/portal/5532143.

Andrew Turner et al., Freescale Semiconductor, Inc., Using the Built-in Self-Test (BIST) on the MPC5777M, Document No. AN5131, Rev. 0, Oct. 2015.

Xiankun Jin et al., U.S. Appl. No. 15/652,309, filed Jul. 18, 2017, titled Built-In Self Test for A/D Converter.

T.D. Ter Braak, S.T. Burgess, H. Hurskainen, H.G. Kerkhoff, B. Vermeulen, X. Zhang, "On-line dependability enhancement of multiprocessor SoCs by resource management," in proc. Int. Symp. on System on Chip, pp. 103-110, 2010.

X. Zhang, H.G. Kerkhoff, B. Vermeulen, "On-chip Scan-Based Test Strategy for a Dependable Many-Core Processor Using a NoC as a Test Access Mechanism," in proc. Euromicro Conf. on Digital System Design: Architectures, Methods and Tools, pp. 531-537, 2010.

A. Cook, M. Elm, H.J. Wunderlich, and U. Abelein, "Structural In-Field Diagnosis for Random Logic Circuits," in proc. IEEE European Test Symp., pp. 111-116, 2011.

U. Abelein, A. Cook, P. Engelke, M. Glass, F. Reimann, L.R. Gomez, T. Russ, J. Teich, D. Ull, H.J. Wunderlich, "Non-intrusive integration of advanced diagnosis features in automotive E/Earchitectures," in proc. Design, Automation & Test in Europe Conf. (DATE), pp. 1-6, 2014.

C. Gleichner, H.T. Vierhaus, P. Engelke, "Scan Based Tests via Standard Interfaces," in proc. Euromicro Conf. on Digital System Design, pp. 844-851, 2012.

Mishra, Geetishree et al.; "Deploying Health Monitoring ECU Towards Enhancing the Performance of In-Vehicle Network"; 7 pages; 2012.

Jin et al., U.S. Appl. No. 15/839,174, filed Dec. 12, 2017, titled "Non-Intrusive On-Chip Analog Test/Trim/Calibrate Subsystem".

Deb et al., U.S. Appl. No. 16/115,058, filed Aug. 28, 2018, titled "Network Interface Device and Method for Operating a Network Interface Device".

* cited by examiner

US 10,816,595 B2

SELF-TEST APPARATUSES HAVING DISTRIBUTED SELF-TEST CONTROLLER CIRCUITS AND CONTROLLER CIRCUITRY TO CONTROL SELF-TEST EXECUTION BASED ON SELF-TEST PROPERTIES AND METHOD THEREOF

OVERVIEW

Aspects of various embodiments are directed to self-test apparatuses involving distributed self-test controller circuits and methods thereof.

Electronic systems can include many individual integrated circuits (ICs) devices. Testing of such electronic systems can involve a system wide in-field test in order to comply with various functional safety requirements, such as for autonomous driving or other automotive electronic systems, as well as the use of an external instrument or tester, making in-field testing difficult.

These and other matters have presented challenges to efficiencies of self-test apparatus implementations, for a variety of applications.

SUMMARY

Various example embodiments are directed to issues such as those addressed above and/or others which may become apparent from the following disclosure concerning a self-test apparatus having distributed self-test controller circuits.

In certain example embodiments, aspects of the present disclosure involve a self-test apparatus that includes a plurality of circuit devices that each has a distributed self-test controller circuit used to negotiate a self-test protocol between devices.

In a more specific example embodiment, a self-test apparatus is for use in an electronic system, such as for use in an automotive electronic system. The self-test apparatus includes an inter-chip communication bus, a plurality of circuit devices, circuitry including memory, and test controller circuitry. The plurality of circuit devices each has a distributed self-test controller circuit and analog, mixed signal (AMS) or digital circuit elements. The distributed self-test controller circuits are integrated communicatively via the inter-chip communication bus and can negotiate a self-test protocol with each other, as well communicate with the circuit elements. The circuitry including memory, stores self-test properties of the circuit elements. The self-test properties correspond to an identifier (ID) of each of the circuit elements and a manner or protocol in which the circuit elements are tested. The test controller circuitry collects the self-test properties of the circuit elements and controls execution of a self-test according to the negotiated self-test protocol and the self-test properties. The negotiated self-test protocol can be initiated at different points of time of operating the electronic system.

In accordance with various embodiments, the AMS or digital circuit elements include logic, a processor, a communication interface (e.g., high-speed input/output (IO) interface for Ethernet or USB, or memory access), an analog circuit (e.g., amplifier, filter, mixer, voltage regulator, a mixed-signal circuit, such as an ADC, DAC or PLL), and controller circuitry (e.g., hardware design/modules with particular functionality, such as those related to Ethernet, multiplier, USB, DSP, etc.). The distributed self-test controller circuits can identify and control testing resources used to test the circuit elements associated with the circuit devices during the execution of the self-test, and monitors results of the self-test.

The circuitry including the memory and the test controller circuitry can be part of other components or separate components of the apparatus, in various embodiments. For example, the memory and test controller circuit include the distributed self-test controller circuits of the plurality of circuit devices. Each distributed self-test controller circuits can collect and store self-test properties of circuit elements associated with the respective circuit device that the distributed self-test controller circuit forms part of. In other embodiments, the test controller circuitry is one of the distributed self-test controller circuits which is assigned as a primary distributed self-test controller circuit during the negotiation of the self-test protocol. For example, the test controller circuitry, which is assigned as the primary distributed self-test controller circuit, can execute the self-test according to the negotiated self-test protocol using the self-test properties of the circuit elements at both a board-level and a circuit device-level of the (automotive) electronic system. In a number of related aspects, the circuit elements include test objects and test instruments that store the self-test properties, and at least a portion of circuit elements are connected to at least one of a common voltage or current forcing bus and a common voltage or current sensing bus.

In another specific example embodiment, a self-test apparatus includes a plurality of distributed self-test controller circuits, circuitry including memory, and test controller circuitry. The plurality of distributed self-test controller circuits are in respective circuit devices of the self-test apparatus. Further, the distributed self-test controller circuits are integrated communicatively (with one another) and can negotiate a self-test protocol with each other. The distributed self-test controller circuits communicate with a plurality of AMS or digital circuit elements. The circuitry including memory can store self-test properties for each of the plurality of circuit elements corresponding to, respectively, each of the plurality of distributed self-test controller circuits and circuit devices. The self-test properties correspond to an ID of each of the circuit elements and a manner or protocol in which the circuit elements are tested by one or more of the distributed self-test controller circuits and a test controller circuitry. The test controller circuitry collects the self-test properties of the plurality of circuit elements from each of the circuit devices and controls execution of the self-test according to the negotiated self-test protocol and the self-test properties. The self-test protocol can be (automatically) initiated at different points of time and during a normal operation mode of the self-test apparatus.

As may be appreciated, the respective circuit devices each include a subset of the plurality of circuit elements. And, at least a portion of the circuit elements are connected to at least one a common voltage or current forcing bus and a common voltage or current sensing bus. The circuit elements include test objects and test instruments that provide the self-test properties to the respective self-test controller circuit of the circuit devices that are associated with the circuit elements. For example, the plurality of distributed self-test controller circuits can control testing resources used to test the respective circuit elements during the execution of the self-test, and to analyze results of the self-test.

The circuitry including the memory that stores the self-test properties can include a circuit on the test controller circuitry, the test controller circuitry being one of the respective distributed self-test controller circuits. In specific embodiments, the circuit on the test controller circuitry can include the distributed self-test controller circuit of the respective circuit device. In other embodiments and/or in addition, the circuitry including the memory that stores the self-test properties includes a circuit on each of the plurality of distributed self-test controller circuits. In such embodiments, each respective distributed self-test controller circuit can store self-test properties of the respective circuit elements in one of the respective circuit devices, store application status information, and communicate the self-test properties and application status information to the test controller circuitry via an inter-chip communication bus.

The self-test apparatus, in some specific aspects, can operate in a test configuration mode during which the self-test properties, including the IDs, of one or more of the plurality circuit elements is assigned and/or stored by the circuit elements. Such a test configuration mode can be executed during manufacturing test(s), which may be implemented at the device-level.

Other specific example embodiments are directed to method involving a self-test apparatus. The method can include negotiating a self-test protocol between a plurality of distributed self-test controller circuits in respective circuit devices integrated communicatively, and communicating self-test properties for each of a plurality of AMS or digital circuit elements. The self-test properties can correspond to, respectively, each of the plurality of distributed self-test controller circuits and circuit devices, wherein the self-test properties correspond to an ID of each of the circuit elements and a manner or protocol in which the circuit elements are tested by one or more of the distributed self-test controller circuits and a test controller circuitry. The method further includes collecting, by the test controller circuitry, the self-test properties of the plurality of circuit elements from each of the circuit devices and controlling execution of the self-test according to the negotiated self-test protocol and the self-test properties, wherein the self-test protocol is initiated at different points of time and during a normal operation mode of the self-test apparatus. The method can further include assigning one of the distributed self-test controller circuits as the test controller circuitry during the negotiation of the self-test protocol. In a number of related and specific embodiments, the method further includes identifying and controlling testing resources used to test the circuit elements associated with the circuit devices by the distributed self-test controller circuits and during the execution of the self-test, and monitoring results of the self-test.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
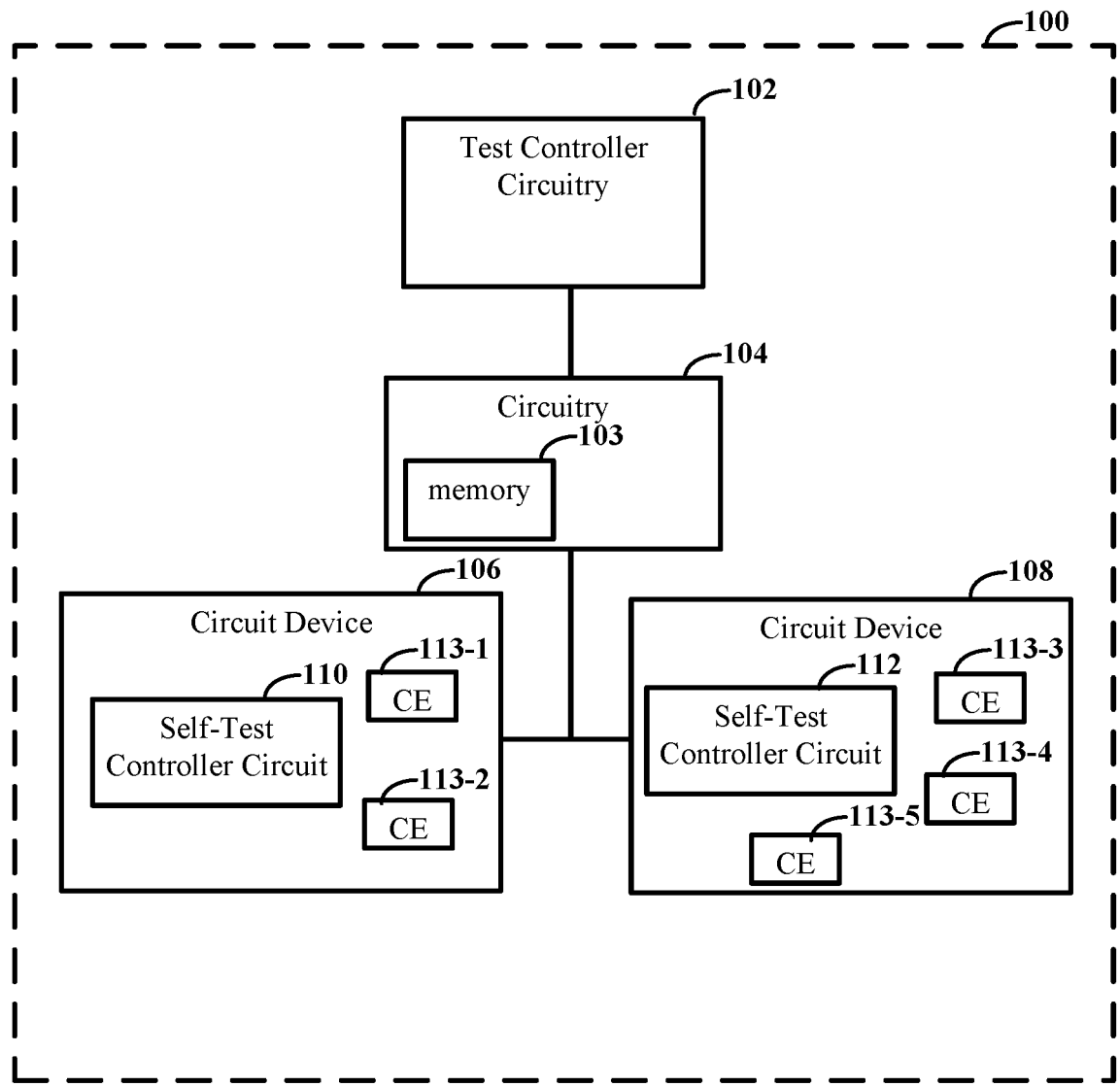
FIG. 1 is an example of a self-test apparatus, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving a self-test apparatus having distributed self-test controller circuits. In certain implementations, aspects of the present disclosure have been shown to be beneficial when used in the context of self-test apparatus that includes a plurality of circuit devices that each has a distributed self-test controller circuit used to negotiate a self-test protocol. In some embodiments, the self-test apparatus can negotiate and execute a self-test at both the device-level and board or system-level. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various electronic systems include a number of different integrated circuit (IC) devices and discrete components on board. Often the different IC devices serve different functional purposes. As a specific example, in certain implementations such as an automotive electronic system, safety protocol or standards of such systems can be stringent. A number of methodologies, such as wafer/package testing, validation, burn-in stress test, and line test, have been developed to minimize systematic faults or permanent defaults in the IC devices and/or the electronic system before deployment in field. To mitigate safety concerns during the lifetime of the electronic system, in-field testing can be used to detect random hardware failures due to latent defects and performance degradation due to aging. At the device level, in-field testing, such as logic and memory built-in self-test (BIST) can be used. However, for various analog, mixed signal (AMS) or digital circuit elements (e.g., IP cores), due to different structural test methods and different types of circuits with different parameters, in-field testing can be difficult. At the board level of the electronic system, various standards (e.g., Institute of Electrical and Electronics Engineers (IEEE) standards) can be used to assist in testing the electronic system, and such standards can further be used to provide common protocols between chip boundaries and internal circuits for testing the devices. Such standards can be dependent on a system-level test engine(s), like an automatic test equipment (ATE) or a tester, to execute the test and which can make in-field testing at the board level difficult. As an example, some IEEE standards can allow a program and read-out instruments like a BIST engine for AMS but such instruments may be unable to handle analog signals themselves. This provides a gap in accessibility of analog defects in the field. Defects in analog circuitry and interconnects between analog and digital sections has been estimated to account for up to 96% of in-system failures for mixed-signal ICs. Embodiments in accordance with the present disclosure are directed to a self-test apparatus for use in an electronic system that can self-test at both the board level and the device level of the electronic system. As further described herein, the plurality of circuit devices forming part of the electronic system each has a distributed self-controller circuit used to negotiate a self-test protocol with each other and to execute a self-test using the negotiated self-test protocol.

As previously described, an electronic system can include a plurality of circuit devices, also sometimes referred to as IC devices and other discrete components on board. Each of the circuit devices has one or more AMS or digital circuit elements, herein referred to as "circuit elements" for ease of reference, that have different capabilities and/or functionalities between devices. Typically, during production testing, each of the circuit devices is treated individually. In accordance with various embodiments, each of the circuit devices has a distributed self-test controller circuit that is integrated communicatively and that negotiates a self-test protocol with one another and also communicate with the respective AMS or digital circuit elements on the respective circuit devices. The distributed self-test controller circuits provide direct interaction between the circuit devices and can allow for resource sharing, such that a self-test on both the device level and board level can be implemented, and without the use of a system-level test engine. Each of the circuit elements has self-test properties including an identifier (ID) and a manner or protocol in which the circuit elements are tested by the distributed self-test controller circuits and a test controller circuitry. The ID is provided to the respective self-test controller circuit of the circuit device such that the self-test controller circuit can identify the respective circuit elements and their self-test properties. Each of the self-test controller circuits identifies the circuit elements associated therewith and uses the same to negotiate a self-test protocol. In various specific embodiments, a test controller circuit collects the self-test properties of the plurality of circuit elements of the plurality of circuit devices and controls execution of a self-test according to the negotiated self-test protocol and the respective self-test properties. The self-test protocol can be initiated at different points of time of operating the electronic system.

In a number of embodiments, a self-test apparatus is part of an electronic system, such as an automotive electronic system. The self-test apparatus includes an inter-chip communication device, a plurality of circuit devices, circuitry including memory configured to store self-test properties of the circuit elements, and a test controller circuitry. As described above, the plurality of circuit device each has a distributed self-test controller and circuit elements. The distributed self-test controller circuits, which are integrated communicatively via the inter-chip communication bus, negotiate a self-test protocol with each other and communicate with the circuit elements. The circuitry including memory, stores self-test properties of the circuit elements. The self-test properties correspond to an ID of each of the circuit elements and a manner or protocol in which the circuit elements are tested. The test controller circuitry collects the self-test properties of the circuit elements and controls execution of a self-test according to the negotiated self-test protocol and the self-test properties.

In accordance with various embodiments, the AMS or digital circuit elements include logic, a processor, a communication interface (e.g., high-speed input/output (IO) interface for Ethernet or USB, or memory access), an analog circuit (e.g., amplifier, filter, mixer, voltage regulator, a mixed-signal circuit, such as an ADC, DAC or PLL), and/or controller circuitry (e.g., hardware design/modules with particular functionality, such as those related to Ethernet, multiplier, USB, DSP, etc.). The distributed self-test controller circuits can identify and control testing resources used to test the circuit elements associated with the circuit devices during the execution of the self-test, and monitor results of the self-test.

The circuitry including the memory and the test controller circuitry can be part of other components or separate components of the apparatus, in various embodiments. For example, the memory and test controller circuit can include the distributed self-test controller circuits of the plurality of circuit devices, each distributed self-test controller circuit being configured and arranged to collect and store self-test properties of circuit elements associated with the respective circuit device that the distributed self-test controller circuit forms part of. In other embodiments, the test controller circuitry is one of the distributed self-test controller circuits which is assigned as a primary distributed self-test controller circuit during the negotiation of the self-test protocol. For example, the test controller circuitry, which is assigned as the primary distributed self-test controller circuit, can execute the self-test according to the negotiated self-test protocol using the self-test properties of the circuit elements at both a board-level and a device-level of the automotive electronic system.

In another specific example embodiments, a self-test apparatus includes a plurality of distributed self-test controller circuits, circuitry including memory, and test controller circuitry. The plurality of distributed self-test controller circuits are in respective circuit devices of the self-test apparatus. Further, the distributed self-test controller circuits are integrated communicatively with one another and can negotiate a self-test protocol with each other. The distributed self-test controller circuits further communicate with a plurality of AMS or digital circuit elements. The circuitry including memory can store self-test properties for each of the plurality of circuit elements corresponding to, respectively, each of the plurality of distributed self-test controller circuits and circuit devices. The test controller circuitry collects the self-test properties of the plurality of circuit elements from each of the circuit devices and controls execution of the self-test according to the negotiated self-test protocol and the self-test properties.

As may be appreciated, the respective circuit devices each include a subset of the plurality of circuit elements. And, at least a portion of the circuit elements are connected to at least one a common voltage or current forcing bus and a common voltage or current sensing bus. The circuit elements include test objects and test instruments that provide the self-test properties to the respective self-test controller circuit of the circuit devices that are associated with the circuit elements. For example, the plurality of distributed self-test controller circuits can control testing resources used to test the respective circuit elements during the execution of the self-test, and to analyze results of the self-test.

The self-test apparatus, in some specific embodiments, can operate in a test configuration mode during which the self-test properties, including the IDs, of one or more of the plurality circuit elements is assigned and/or stored by the circuit elements. Such a test configuration mode can be executed during manufacturing test(s), and may be implemented at the device-level.

Other specific example embodiments are directed to methods involving a self-test apparatus. For example, the method can include negotiating a self-test protocol between a plurality of distributed self-test controller circuits in respective circuit devices integrated communicatively, and communicating self-test properties for each of a plurality of AMS or digital circuit elements. The self-test properties can correspond to, respectively, each of the plurality of distributed self-test controller circuits and circuit devices, wherein the self-test properties correspond to an ID of each of the circuit elements and a manner or protocol in which the circuit elements are tested by one or more of the distributed self-test controller circuits and a test controller circuitry. The method further includes collecting, by the test controller circuitry, the self-test properties of the plurality of circuit elements from each of the circuit devices and controlling execution of the self-test according to the negotiated self-test protocol and the self-test properties, wherein the self-test protocol is (automatically) initiated at different points of time and during a normal operation mode of the self-test apparatus. The method can further include assigning one of the distributed self-test controller circuits as the test controller circuitry during the negotiation of the self-test protocol. In a number of related and specific embodiments, the method further includes identifying and controlling testing resources used to test the circuit elements associated with the circuit devices by the distributed self-test controller circuits and during the execution of the self-test, and monitoring results of the self-test.

Turning now to the figures, FIG. 1 is an example of a self-test apparatus, in accordance with the present disclosure. As illustrated, the self-test apparatus 100 includes a plurality of circuit devices 106, 108, circuitry 104 with memory 103, and test controller circuitry 102. The circuit devices 106, 108 can be treated individually during production test and also tested in-field. For example and as further described herein, the self-test apparatus 100 can be used to perform an in-field test of an electronic system at both the device-level and board (e.g., system)-level. The circuit devices 106, 108 have self-test controller circuits 110, 112 used to negotiate a self-test protocol that allows for direct interaction between the circuit devices 106, 108 using the integrated test controller circuitry 102 and allowing for resource sharing (without requiring a system-level test engine).

The circuit devices 106, 108 can include or refer to IC or a single silicon chip or a multi-chip module within an IC package. Each of the circuit devices 106, 108 has a distributed self-test controller circuit 110, 112 and a plurality of AMS or digital circuit elements 113-1, 113-2, 113-3, 113-4, 113-5, referred to as "circuit elements 113" for ease of reference. The circuit elements 113 are the IP or module within an IC. Example circuit elements include one of logic, a processor, a communication interface (e.g., high-speed IO interface for Ethernet or USB or memory access), an analog circuit (e.g., amplifier, filter, mixer, voltage regulator, a mixed-signal circuit, such as an ADC, DAC, or PLL), and/or controller circuitry (e.g., hardware design/modules with particular functionality, such as those related to Ethernet, multiplier, USB, DSP, etc.).

The distributed self-test controller circuits 110, 112 provide a variety of functions. The distributed self-test controller circuits 110, 112 are integrated communicatively, such as via an inter-chip communication bus as further illustrated by FIG. 2. Additionally, the distributed self-test controller circuits 110, 112 communicate with the circuit elements 113 and each other to negotiate a self-test protocol. The distributed self-test controller circuits 110, 112 can identify and control testing resources used to test the circuit elements 113 associated with the circuit devices during the execution of the self-test, and monitors results of the self-test. In specific embodiments, the negotiation is based on self-test properties of the circuit elements 113, as further described herein.

The apparatus 100 can include circuitry 104 that includes memory 103 used to store the self-test properties of the circuit elements 113. The self-test properties can correspond to an ID of each of the circuit elements 113 and a manner or protocol in which the circuit elements 113 are tested. In various embodiments, the circuitry 104 including memory 103 is distributed on each of the self-test controller circuits 110, 112. For example, the circuitry 104 and memory 103 include a portion of the self-test controller circuits 110, 112. Although embodiments are not so limited and the circuitry 104 can be separate from, and in communication with the self-test controller circuits 110, 112 and used to collect the self-test properties.

In either embodiments, each distributed self-test controller circuit 110, 112 collects and stores self-test properties of circuit elements 113 associated with the respective circuit device 106, 108 that the distributed self-test controller circuit 110, 112 forms part of. As further described herein, the circuit elements 113 are assigned, during a test configuration mode, the self-test properties and store the same. In specific embodiments, a unique ID is assigned to and stored by each of the circuit elements 113. For example, the circuit elements 113 can include test objects and test instruments that store the self-test properties, and at least a portion of circuit elements 113 are connected to at least one of a common voltage or current forcing bus and a common voltage or current sensing bus, as further illustrated herein by FIGS. 2-3. The circuit elements 113 provide the self-test properties, including the ID, to the self-test controller circuit on the same circuit device as the respective circuit element. The self-test controller circuits 110, 112 interfaces with the circuit elements 113 of the same circuit device 106, 108 to obtain the various self-test properties and stores the same, such as in a table. Using the self-test properties, the respective self-test controller circuit 110, 112 identifies forcing and sensing resources to be used to test the respective circuit elements 113, locates the identified resources, and takes control of the resources. As further described herein, during a self-test, the circuit elements 113 are tested and the results of the self-test are provided by the respective self-test controller circuits 110, 112 to the test controller circuitry 102.

The test controller circuitry 102 collects the self-test properties of the circuit elements 113 and controls execution of the self-test according to the negotiated self-test protocol and the self-test properties. As previously described, the negotiated self-test protocol is initiated at different points of time of operating the automotive electronic system. The test controller circuitry 102 can include circuitry that is different than the circuit device or, in a number of embodiments, the test controller circuitry 102 is one of the distributed self-test controller circuits which is assigned as a primary distributed self-test controller circuit during the negotiation of the self-test protocol. For example, the test controller circuitry 102, which is assigned as the primary distributed self-test controller circuit, can execute the self-test according to the negotiated self-test protocol using the self-test properties of the circuit elements 113 at both a board-level and a circuit device-level of an electronic system, such as an automotive electronic system. Specifically, as further described herein, the distributed self-test controller circuits 110, 112, which are at the device-level, execute self-tests within and across circuit devices 106, 108 of the apparatus, and without the use of a system-level test engine.

Figure 2:
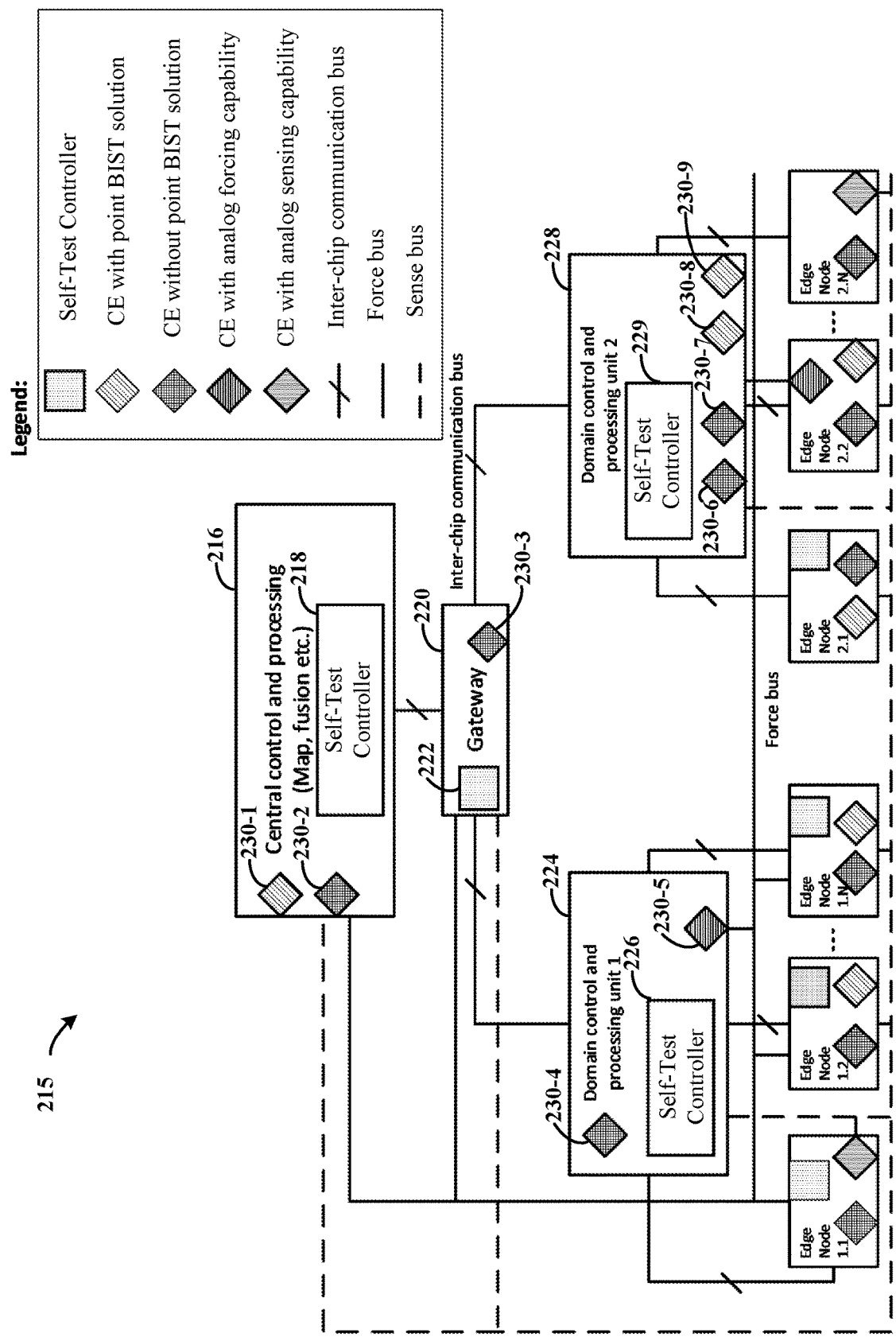
FIG. 2 is an example of a self-test apparatus for use in an automotive electronic system, in accordance with the present disclosure.

FIG. 2 is an example of a self-test apparatus for use in an automotive electronic system, in accordance with the present disclosure. Similarly to that previously described in connection with FIG. 1, the self-test apparatus 215 includes an inter-chip communication bus, a plurality of circuit devices 216, 220, 224, 228 each having a distributed self-test controller circuit 218, 222, 226, 229 and a plurality of circuit elements 230-1, 230-2, 230-3, 230-4, 230-5, 230-6, 230-7, 230-8, 230-9 (herein referred to generally as "circuit elements 230" for ease of reference), circuitry including memory (which is not separately illustrated, and can form part of each of the distributed self-test controller circuits 218, 226, 229), and test controller circuitry (e.g., one of the distributed self-test controller circuits 218, 226, 229). For ease of reference, FIG. 2 does not number each of the circuit devices 216, 220, 224, 228 and/or circuit elements 230. Rather, a representative number of the circuit devices 216, 220, 224, 228 and circuit elements 230 are numbered.

As illustrated, the different circuit elements 230 can include different types of AMS or digital circuit elements, such as illustrated by the legend. The different circuit elements can include circuit elements with a built-in self-test (BIST) solution, circuit elements without a BIST solution, circuit elements with analog forcing capability, and/or circuit elements with analog sensing capability.

The self-test apparatus 215 operates similarly to that previously described in connection with FIG. 1. The specific self-test apparatus 215 is adapted for an automotive electronic system that is, optionally, domain-based. The domain-based automotive electronic system illustrated by FIG. 2 divides the system into several domains with each domain being responsible for a particular functionality.

The inter-chip communication bus provides communication between each of the circuit devices 216, 220, 224, 228, and which is used to negotiate the self-test protocol including assigning one of the distributed self-test controller circuit 218, 222, 226, 229 as the test controller circuitry. As may be appreciated, and as illustrated, each of the circuit devices 216, 220 224, 228 includes a subset of the circuits elements 230. And, at least a portion of the circuit elements 230 are connected to at least one of a common voltage or current forcing bus and a common voltage or current sensing bus. Accordingly, the inter-chip communication bus connects self-test controller circuits 218, 222, 226, 229 of different circuit devices 216, 220, 224, 228 following the same or similar protocol(s). The common voltage or current forcing bus and a common voltage or current sensing bus connect different circuit elements on one circuit device and inter-devices. And, the circuit elements can be test objects and/or test instruments. The self-test controller circuit 218, 222, 226, 229 that is within the same circuit device 216, 220, 224, 228 as the respective subset of circuit elements 230 communicates with the respective subset of circuit elements 230 belonging to the same circuit device 216, 220, 224, 228 and respectively controls self-testing of the same.

Similarly to FIG. 1, the self-test apparatus 215 can implement device-level self-test controller circuits 218, 222, 226, 229 within each circuit device 216, 220, 224, 228 which executes tests within and across devices without the use of a system-level test engine by assigning one of the self-test controller circuits 218, 222, 226, 229 as the primary controller for the rest of the controller circuits. The common voltage or current forcing bus and a common voltage or current sensing bus connect distributed forcing and sensing circuits among the circuit devices 230 that are controlled by the self-test controller circuits 218, 222, 226, 229 to implement testing measurements of AMS circuit elements. The self-test apparatus 215 thereby implements a self-test protocol that allows for in-field testing of electronic systems and devices within.

Figure 3:
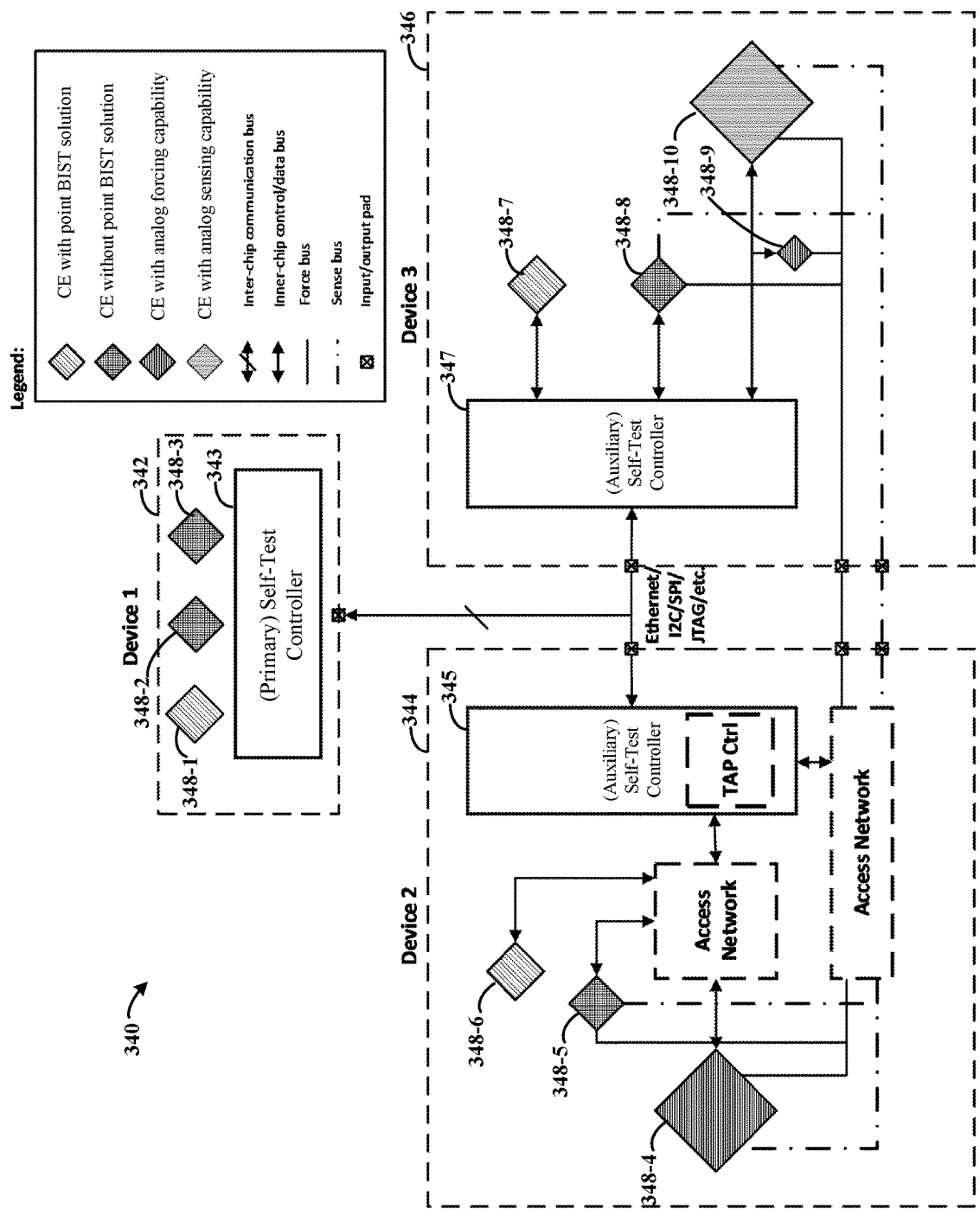
FIG. 3 is another example of a self-test apparatus, in accordance with the present disclosure.

FIG. 3 is another example of a self-test apparatus, in accordance with the present disclosure. As illustrated, the self-test apparatus 340 includes a self-test controller circuit 343, 345, 347 on each of the circuit devices 342, 344, 346, circuitry to store self-test properties of respective circuit elements (e.g., not separately illustrated, and can be components of the circuit devices/self-test controller circuits 343, 345, 347), and test controller circuitry (e.g., the primary self-test controller circuit 343). As previously described, one of the self-test controller circuits on the circuit devices can be the test controller circuitry, in accordance with various embodiments. Additionally, as described above in connection with FIG. 2, the plurality of circuit elements 348-1, 348-2, 348-3, 348-4, 348-5, 348-6, 348-7, 348-8, 348-9, 348-10 (herein generally referred to as "circuit elements 348" for ease of references) includes different types circuit elements, such as forcing and sensing circuit elements and individual circuit elements under test distribution within the system and as illustrated by the legend.

The distributed self-test controllers 343, 345, 347 on each of the circuit devices 342, 344, 346 within the electronic system can negotiate and communicate among themselves to realize a complete independent self-test mechanism within the system to allow in-field test. As previously described, a plurality of distributed self-test controller circuits 343, 345, 347 in the circuit devices are integrated communicatively and can negotiate a self-test protocol with each other. For example, the plurality of distributed self-test controller circuits 343, 345, 347 can control testing resources used to test the respective circuit elements 348 during the execution of the self-test, and to analyze results of the self-test.

The self-test controller circuits 343, 345, 347 further communicate with the plurality circuit elements 348. As previously described, the distributed circuit elements 348 on different circuit devices 342, 344, 346 can be identified as test instruments connecting on common voltage or current forcing bus and a common voltage or current sensing bus to enable same device or cross device testing. For example, the circuit elements 348 include test objects and test instruments that provide the self-test properties to the respective self-test controller circuit of the circuit devices that are associated with the circuit elements.

In a number of embodiments, circuitry (including memory) stores self-test properties for each of the plurality of circuit elements corresponding to, respectively, each of the plurality of distributed self-test controller circuits 343, 345, 347 and circuit devices 342, 344, 346. The circuitry can be a distributed circuit on each of the self-test controller circuits 343, 345, 347 that are used to store self-test properties of respective circuit elements 348 in (e.g., integrated on) one of the respective circuit devices. Such distributed circuits can further store application status information, and be used to communicate the self-test properties and application status information to the test controller circuitry (e.g., primary self-test controller circuit 343) via an inter-chip communication bus. In other embodiments and/or in addition, the circuitry including the memory includes a circuit on the test controller circuitry, the test controller circuitry being one of the respective distributed self-test controller circuits, and which is used to collect self-test properties from all of the plurality of circuit elements.

As previously described, the test controller circuitry, which is one of the self-test circuit devices in the embodiment illustrated by FIG. 3, collects the self-test properties of the plurality of circuit elements 348 from each of the circuit devices 342, 344, 346 and controls execution of the self-test according to the negotiated self-test protocol and the self-test properties. The self-test protocol can be initiated at different points of time and during a normal operation mode of the self-test apparatus. In accordance with embodiments herein, each of the self-test controller circuits 343, 345, 347 collects respective self-test properties of the circuit elements 348 within the respective circuit devices and communicate with one another to negotiate the self-test protocol.

Part of the negotiation can include assigning one of the self-test controller circuits as test controller circuitry, which is interchangeably referred to as the primary self-test controller 343. The primary self-test controller circuit 343 serves as a top level control instance to command the test procedure of the whole system with knowledge provided by individual circuit elements 348 through remaining (e.g., auxiliary) self-test controller circuits 345, 347. Specific components of each of the self-test controller circuits are further illustrated and described in connection with FIG. 4. Additionally, as previously described, the self-test apparatus 340 is configured and arranged to operate in a test configuration mode during which the self-test properties, including the IDs, of one or more of the circuit elements 348 is assigned.

As previously described, the self-test apparatus 340 can further include the plurality of circuit elements 348, an inter-chip communication bus under a common protocol, common voltage or current forcing bus and a common voltage or current sensing bus, and, optionally, an access network between the self-test controller circuits 343, 345, 347 and the circuit elements 348. The access network sits between self-test control circuits 343, 345, 347 and circuit elements 348 to standardize the connections. An example is IEEE 1687. Depending on the complexity of the circuit elements 348 and self-test controller circuits 343, 345, 347, not all embodiments include such an access network.

Figure 4:
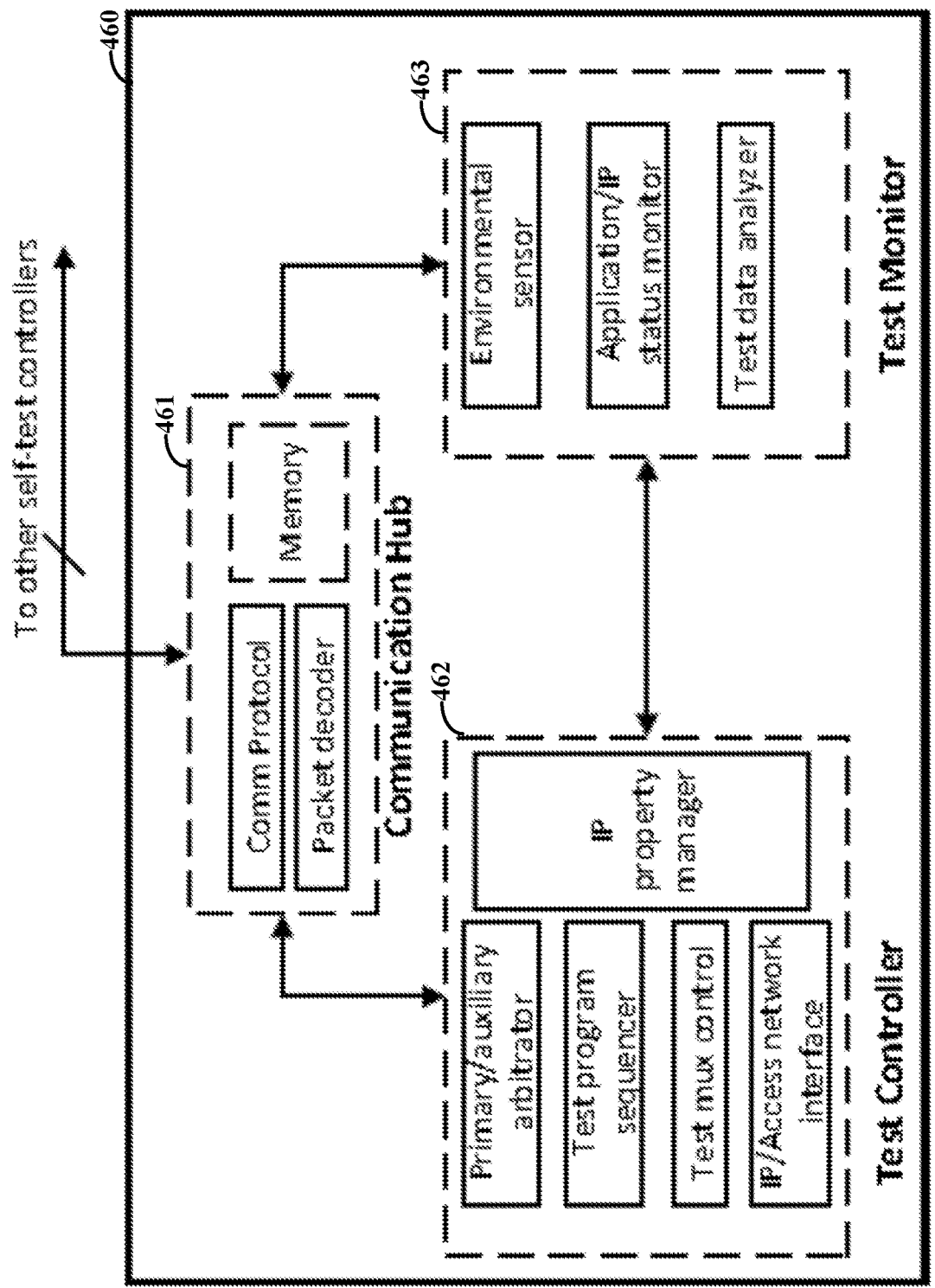
FIG. 4 is an example of a self-test controller circuit, in accordance with the present disclosure.

FIG. 4 is an example of a self-test controller circuit, in accordance with the present disclosure. As previously described, each of the distributed self-test controller circuits can provide a variety of functions. More specifically, FIG. 4 illustrates an exemplary implementation of the self-test controller circuit 460 which includes different sub-blocks to realize above-described functions. However, the arrangement of the sub-block(s) does not always follow this example given all functions are fulfilled. The entire self-test controller circuit 460 can be implemented as a dedicated hardware block, or it can be realized by a common central processing unit (CPU) and memory.

As previously described, self-test controller circuits are implemented on each individual circuit device within the system. Each of the self-test controller circuits provides one or more of the following functions: a communication hub 461, a test controller 462, and a test monitor 463.

A communication hub 461 communicates with other self-test controller circuits. The communication hub 461 can incorporate one or more of common communication protocols which are widely adopted in the industry, e.g. Ethernet, Controller Area Network (CAN), Local Interconnect Network (LIN), Flexray, Inter-integrated circuit (I2C), Serial Peripheral Interface (SPI), Joint Test Action Group (JTAG), etc. "Communication Protocol" in FIG. 4 represents above-described activities. The communication hub 461 further communicates and decodes the commands and data between self-test controller circuits, stores them in memory when needed, and feeds them to the test monitor. "Packet decoder" and "Memory" in FIG. 4 represent the above-described activities.

A test controller 462 is used to control the tests of circuit elements. The test controller 462 negotiates with test controllers of other self-test controller circuits to determine which one is the primary in the system and which are auxiliary. "Primary/Auxiliary arbitrator" in FIG. 4 represents above-described activities. When designated as primary, the test controller 462 collects information from auxiliary self-test controller circuits. It also sends and receives commands and data from and to auxiliary self-test controller circuits. When designated as auxiliary, the test controller 462 collects information from circuit elements under its supervision on the same circuit device and provides this information to primary self-test controller circuit. It also receives and sends command and data from primary self-test controller circuit.

The test controller 462 can further interface with the circuit elements under test either directly, or through an access network, e.g., IEEE 1687 compliant network. "IP/Access network interface" in FIG. 4 represents above-described activities. The test controller 462 maintains and builds a table through an "IP property manager" which contains a list of self-test properties of each individual circuit element. The self-test properties are further described below. The test controller 462 can further identify the forcing and sensing resources used to test the circuit elements, locates the resources within the circuit device or across circuit devices, and takes over control of the resources when available directly on the same circuit device through "Test mux control" or through the communication hub 461 when across circuit devices. The test controller 462 can trigger preprogrammed test procedures of the circuit elements concurrently, serially, or a mixed mode with some circuit elements tested concurrently and some tested serially. It can be controlled by a "Test program sequencer."

The test monitor 463 is used to monitor the environment, application status and analyze the test results from circuit elements under test. The test monitor 463 incorporates an environmental sensor to monitor the voltage and temperature change for the self-test controller circuit 460 to determine if an in-field test is required. The test monitor 463 monitors the status (busy, idle, etc.) of the running application of the circuit device and/or status (busy, idle, etc.) of the circuit device to determine if it is a good time to run a self-test and diagnosis shown as "Application/IP status monitor." Further, the test monitor 463 can analyze the test data from each circuit element being tested to arrive at a pass/fail conclusion for the system to use shown as "Test data analyzer."

The circuit elements can be categorized into test objects and as instruments. However, one or more circuit elements can be both a test object and instrument at the same time. To allow for negotiation of the self-test protocol, the circuit elements provide information that can be accessed in digital form which can be read in by "IP property manager," or in documentation form which can be consumed by a reader to implement the test, or the combination of both. The properties include: ID number of the circuit which is unique and can, optionally, indicate the desired sequence of being tested; test instrument capability provided to a voltage or current forcing bus and/or a voltage or current sensing bus and test requirement as a test object. The test instrument capability can include forcing capability (e.g., voltage or current forcing, resolution, accuracy, operating range, loading requirement, special characteristics—clock, sine, ramp, etc.) and/or sensing capability (e.g., voltage or current sensing, resolution, accuracy, operating range). The test requirement as a test object can include type of instrument needed, test operation procedures, test time required, and/or expected test results and limits.

Various embodiments are directed to methods involving such example self-test apparatuses. An example method includes negotiating a self-test protocol between a plurality of distributed self-test controller circuits in respective circuit devices integrated communicatively and communicating self-test properties for each of a plurality of circuit elements. The circuit elements, as previously described, correspond to, respectively, each of the plurality of distributed self-test controller circuits and circuit devices. Additionally, the self-test properties correspond to an ID of each of the circuit elements and a manner or protocol in which the circuit elements are tested by one or more of the distributed self-test controller circuits and a test controller circuitry. The method further includes collecting, by the test controller circuitry, the self-test properties of the plurality of circuit elements from each of the circuit devices and controlling execution of the self-test according to the negotiated self-test protocol and the self-test properties, wherein the self-test protocol is initiated at different points of time and during a normal operation mode of the self-test apparatus. As previously described, the method can further include assigning one of the distributed self-test controller circuits as the test controller circuitry during the negotiation of the self-test protocol. And, the method can include identifying and controlling testing resources used to test the circuit elements associated with the circuit devices by the distributed self-test controller circuits and during the execution of the self-test, and to monitor results of the self-test.

Figure 5:
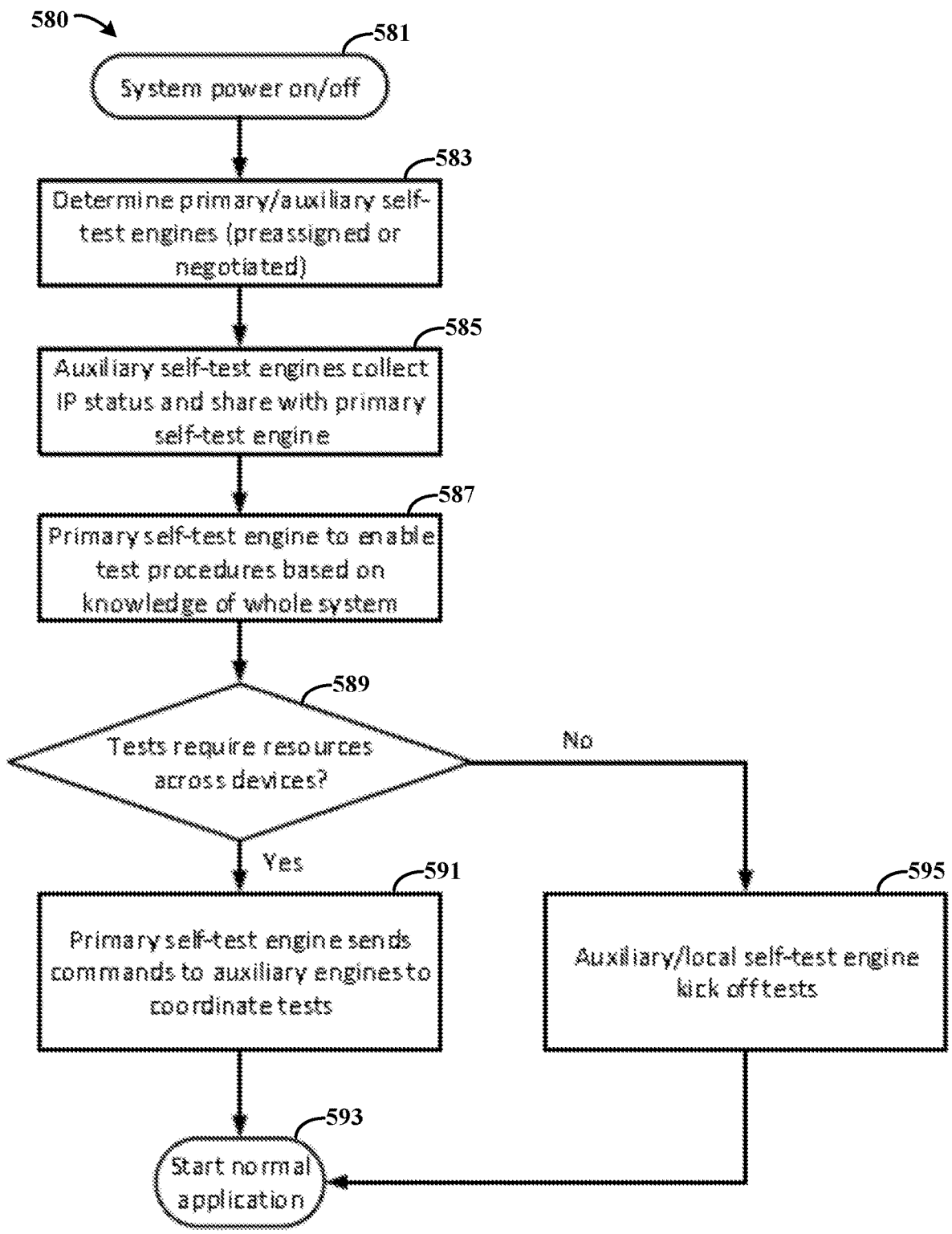
FIG. 5 is an example process implemented using a self-test apparatus, in accordance with the present disclosure.

An exemplary sequence of execution steps of the example apparatuses described herein is further illustrated by FIG. 5. This assumes when the system is powered up or powered down, the self-test controller circuits are triggered to perform routine tests. There are other possibilities where the system is running application, but self-test controller circuits are periodically/randomly enabled to check the status of circuit element/application and perform tests when certain circuit elements are available for test.

FIG. 5 is an example process implemented using a self-test apparatus, in accordance with the present disclosure. The method 580, at 581, includes a system power on. In response, at 583, the method includes determining which of the plurality of self-test controller circuits are auxiliary and which one is the primary self-test controller circuit. The determination can be based on domains, random, and/or based on other factors. At 585, the method 580 further includes each of the auxiliary self-test controller circuits collecting circuit element status (e.g., based on or otherwise including the self-test properties) and sharing the same with the primary self-test controller circuit. At 587, the primary self-test controller circuit enables test procedures based on knowledge of the system as a whole. At 589, a determination is made on whether the particular self-test requires resources across more than one of the circuit devices. If yes, at 591, the primary self-test controller circuit sends commands to the auxiliary self-test controller circuits to coordinate the test. If not, at 595, the auxiliary self-test controller circuits perform the test (without coordination). After executing the self-test, at 593, normal application can begin.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 108 and 110 of FIG. 1 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 2-4. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described in connection with FIG. 5, is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, the apparatuses illustrated by FIGS. 1-3 can include one or more of the self-test controller circuit as illustrated by FIG. 4. As another example, the method illustrated by FIG. 5 can be implemented using the circuitry illustrated by FIGS. 1-4. Such modifications do not depart from the true spirit and scope of various aspects of the disclosure, including aspects set forth in the claims.

What is claimed is:

1. A self-test apparatus for use in an automotive electronic system, comprising:
an inter-chip communication bus;

a plurality of circuit devices each having a distributed self-test controller circuit and analog, mixed signal or digital circuit elements, the distributed self-test controller circuits being integrated communicatively via the inter-chip communication bus and configured and arranged to negotiate a self-test protocol with each other and to communicate with the circuit elements;

circuitry including memory configured to store self-test properties of the circuit elements, the self-test properties corresponding to an identifier (ID) of each of the circuit elements and a manner or protocol in which the circuit elements are tested; and test controller circuitry configured and arranged to collect the self-test properties of the circuit elements and to control execution of the self-test according to the negotiated self-test protocol and the self-test properties, wherein the negotiated self-test protocol is initiated at different points of time of operating the automotive electronic system.

2. The self-test apparatus of claim 1, wherein the circuit elements includes at least one of logic, a processor, a communication interface, an analog circuit, and controller circuitry, and the distributed self-test controller circuits are configured and arranged to identify and control testing resources used to test the circuit elements associated with the circuit devices during the execution of the self-test, and to monitor results of the self-test.

3. The self-test apparatus of claim 1, wherein the circuitry including the memory and the test controller circuitry include the distributed self-test controller circuits of the plurality of circuit devices, each distributed self-test controller circuit being configured and arranged to collect and store self-test properties of circuit elements associated with the respective circuit device that the distributed self-test controller circuit forms part of.

4. The self-test apparatus of claim 1, wherein the test controller circuitry is one of the distributed self-test controller circuits which is assigned as a primary distributed self-test controller circuit during the negotiation of the self-test protocol.

5. The self-test apparatus of claim 4, wherein the test controller circuitry, which is assigned as the primary distributed self-test controller circuit, is further configured and arranged to execute the self-test according to the negotiated self-test protocol using the self-test properties of the circuit elements at both a board-level and a device-level of the automotive electronic system.

6. The self-test apparatus of claim 1, wherein the elements include test objects and test instruments configured and arranged to store the self-test properties, and at least a portion of circuit elements are connected to at least one of a common voltage or current forcing bus and a common voltage or current sensing bus.

7. A self-test apparatus, comprising:

a plurality of distributed self-test controller circuits in respective circuit devices integrated communicatively and arranged to negotiate a self-test protocol with each other and to communicate with a plurality of analog, mixed signal (AMS) or digital circuit elements;

circuitry including memory configured to store self-test properties for each of the circuit elements corresponding to, respectively, each of the plurality of distributed self-test controller circuits and circuit devices, wherein the self-test properties correspond to an identifier (ID) of each of the circuit elements and a manner or protocol in which the circuit elements are tested by one or more of the distributed self-test controller circuits and a test controller circuitry; and the test controller circuitry configured and arranged to collect the self-test properties of the plurality of circuit elements from each of the circuit devices and to control execution of the self-test according to the negotiated self-test protocol and the self-test properties, wherein the self-test protocol is initiated at different points of time and during a normal operation mode of the self-test apparatus.

8. The self-test apparatus of claim 7, wherein the respective circuit devices each include a subset of the circuit elements and at least a portion of circuit elements are connected to at least one of a common voltage or current forcing bus and a common voltage or current sensing bus.

9. The self-test apparatus of claim 7, wherein the self-test apparatus is configured and arranged to operate in a test configuration mode during which the self-test properties, including the IDs, of one or more of the circuit elements are assigned.

10. The self-test apparatus of claim 7, wherein the circuitry including the memory configured and arranged to store the self-test properties includes a circuit on the test controller circuitry, the test controller circuitry being one of the respective distributed self-test controller circuits.

11. The self-test apparatus of claim 7, wherein the circuitry including the memory configured and arranged to store the self-test properties includes the plurality of distributed self-test controller circuits, each respective distributed self-test controller circuit being configured and arranged to store self-test properties of respective circuit elements in one of the respective circuit devices, to store application status information, to communicate the self-test properties and application status information to the test controller circuitry via an inter-chip communication bus.

12. The self-test apparatus of claim 11, wherein the circuitry including the memory configured and arranged to store the self-test properties includes a circuit on the test controller circuitry, the test controller circuitry being one of the respective circuit devices.

13. The self-test apparatus of claim 12, wherein circuit on the test controller circuitry includes the distributed self-test controller circuit of the respective circuit device.

14. The self-test apparatus of claim 7, wherein the circuit elements include test objects and test instruments configured and arranged to provide the self-test properties to the respective self-test controller circuit of the circuit devices that are associated with the circuit elements.

15. The self-test apparatus of claim 7, wherein the plurality of distributed self-test controller circuits are configured and arranged to control testing resources used to test the respective circuit elements during the execution of the self-test, and to analyze results of the self-test.

16. A method involving a self-test apparatus, the method comprising:

negotiating a self-test protocol between a plurality of distributed self-test controller circuits in respective circuit devices integrated communicatively;

communicating self-test properties for each of a plurality of analog, mixed signal or digital circuit elements corresponding to, respectively, each of the plurality of distributed self-test controller circuits and circuit devices, wherein the self-test properties correspond to an identifier (ID) of each of the circuit elements and a manner or protocol in which the circuit elements are tested by one or more of the distributed self-test controller circuits and a test controller circuitry; and collecting, by the test controller circuitry, the self-test properties of the circuit elements from each of the circuit devices and controlling execution of the self-test according to the negotiated self-test protocol and the self-test properties, wherein the self-test protocol is initiated at different points of time and during a normal operation mode of the self-test apparatus.

17. The method of claim 16, further including identifying and controlling testing resources used to test the circuit elements associated with the circuit devices by the distributed self-test controller circuits and during the execution of the self-test, and monitoring of the self-test.

18. The method of claim 16, further including assigning one of the distributed self-test controller circuits as the test controller circuitry during the negotiation of the self-test protocol.

* * * * *